United States Patent
Pengelly

(10) Patent No.: US 7,764,120 B2
(45) Date of Patent: Jul. 27, 2010

(54) INTEGRATED CIRCUIT WITH PARALLEL SETS OF TRANSISTOR AMPLIFIERS HAVING DIFFERENT TURN ON POWER LEVELS

(75) Inventor: Raymond Sydney Pengelly, Hillsborough, NC (US)

(73) Assignee: Cree, Inc., Durham, NC (US)

( * ) Notice: Subject to any disclaimer, the term of this patent is extended or adjusted under 35 U.S.C. 154(b) by 7 days.

(21) Appl. No.: 12/194,269

(22) Filed: Aug. 19, 2008

(65) Prior Publication Data
US 2010/0045385 A1 Feb. 25, 2010

(51) Int. Cl.
*H03F 3/68* (2006.01)
(52) U.S. Cl. .................. 330/124 R; 330/295
(58) Field of Classification Search ............ 330/295, 330/124 R, 84, 53, 286
See application file for complete search history.

(56) References Cited

U.S. PATENT DOCUMENTS

| | | | |
|---|---|---|---|
| 6,316,793 B1 | 11/2001 | Sheppard et al. | |
| 6,700,444 B2 | 3/2004 | Pengelly et al. | |
| 6,737,922 B2 | 5/2004 | Pengelly et al. | |
| 6,791,417 B2 | 9/2004 | Pengelly et al. | |
| 6,798,295 B2 | 9/2004 | Pengelly et al. | |
| 7,078,976 B2 * | 7/2006 | Blednov | 330/286 |
| 7,193,473 B2 | 3/2007 | Pengelly et al. | |
| 7,301,395 B2 * | 11/2007 | Mobbs | 330/124 R |
| 7,368,971 B2 | 5/2008 | Pengelly | |
| 2002/0066908 A1 | 6/2002 | Smith | |
| 2002/0167023 A1 | 11/2002 | Chavarkar et al. | |
| 2004/0061129 A1 | 4/2004 | Saxler et al. | |
| 2006/0044060 A1 | 3/2006 | Shiikuma | |
| 2008/0139131 A1 | 6/2008 | Macphail | |

FOREIGN PATENT DOCUMENTS

WO WO 2004/017512 A1 2/2004

OTHER PUBLICATIONS

Wang et al. "Envelope Tracking Power Amplifier with Pre-Distortion Linearization for WLAN 802.11g" *International Microwave Symposium Digest*, Forth Worth, TX. vol. 3. IEEE, 2004. 1543-546. Print, Jun. 6, 2004.

(Continued)

*Primary Examiner*—Robert Pascal
*Assistant Examiner*—Hieu P Nguyen
(74) *Attorney, Agent, or Firm*—Myers Bigel Sibley & Sajovec, P.A.

(57) ABSTRACT

A power amplifier circuit includes a power splitter that splits an input signal into a plurality of component input signals. At least two sets of transistor amplifiers are each coupled in parallel to the power splitter to receive and amplify different ones of the component input signals to generate amplified component output signals. The two transistor amplifiers of each set of transistor amplifiers are configured to turn on at different power levels of the input signal relative to each other. A combiner is configured to receive and combine the amplified component output signals from the at least two sets of transistor amplifiers into an output signal. An integrated circuit package encloses the power splitter, the at least two sets of transistor amplifiers, and the combiner.

25 Claims, 5 Drawing Sheets

OTHER PUBLICATIONS

Wood et al. "A High Power, High Efficiency UMTS Amplifier using a Novel Doherty Configuration" *Proceedings of the Radio and Wireless Conference*. RAWCON '03, Piscataway, NJ. IEEE, 2003. 329-32. Print, Aug. 10, 2003.

International Search Report and Written Opinion, PCT International Application No. PCT/US2009/053974, Dec. 15, 2009.

Doherty, W.H., "A New High-Efficiency Power Amplifier for Modulated Waves," Bell Telephone System, Technical Publications, Radio, Monograph B-931, 25 pages, May 1936.

* cited by examiner

INTEGRATED CIRCUIT WITH PARALLEL SETS OF TRANSISTOR AMPLIFIERS HAVING DIFFERENT TURN ON POWER LEVELS

BACKGROUND

This invention relates generally to electronic circuits, and more particularly, to RF power amplifier circuits.

Power amplifiers, such as power amplifiers used in base stations of cellular communication systems, often operate at output power levels much lower than peak power. Unfortunately, the back-off power level reduces the efficiency of the power amplifier in the transmitter. In a conventional amplifier there is a direct relationship between efficiency and the input drive level. Therefore, high efficiency (DC to RF conversion efficiency) is often not obtained until the RF input power level becomes sufficiently high to drive the amplifier into compression or saturation. In multi-carrier communication systems where it is desirable for an amplifier to remain as linear as possible, this region of high efficiency cannot be used.

A power amplifier circuit design that provides improved efficiency in back-off power levels is the Doherty amplifier circuit, which combines power from a main or carrier amplifier and from an auxiliary or peak amplifier. See, W. H. Doherty, "A New High-Efficiency Power Amplifier for Modulated Waves," Proc. IRE Vol. 24, No. 9, pp. 1163-1182, 1936. A conventional Doherty circuit 20 is illustrated in FIG. 1A. As shown therein, an input signal applied to an input terminal 21 is split by a splitter 22. A main or carrier amplifier 23 and a peak amplifier 26, which receive the input signal from the splitter 22, are designed to deliver maximum power with increased efficiency to a load R. The carrier amplifier 23 receives the input signal directly from the splitter 22, while the peak amplifier 26 receives the input signal through a quarter wave (90°) transformer 25. The output of the carrier amplifier 23 passes through another quarter wave (90°) transformer 24, and is combined with the output of the peak amplifier 26 at a combining node 27. Accordingly, the outputs of the carrier amplifier 23 and the peak amplifier 26 are not isolated from one another. Thus, when the peak amplifier 26 turns on, the apparent load presented to the carrier amplifier 23 changes.

The carrier amplifier 23 is biased as a normal Class B amplifier, while the peak amplifier 26 is designed to only amplify signals which exceed some minimum threshold. For an LDMOS power transistor, this can be accomplished by DC biasing the transistor below its pinch-off voltage, for operation similar to Class C. The outputs of the two amplifiers are connected by a quarter-wave transmission line 24 of characteristic impedance R, and a load of one-half of the optimum load R is attached to the output of the peak amplifier 26. The RF input power is divided equally with a quarter-wave delay 25 at the input to the peak amplifier 26, thus assuring that the output power of the two amplifiers at the load R/2 28 will be in phase.

The Doherty amplifier circuit achieves high efficiency prior to compression by operating the Class B carrier amplifier 23 into an apparent load impedance two times larger than its optimum load. (Before the peak amplifier 26 becomes active, the apparent load impedance presented to the carrier amplifier 23 is 2R due to the presence of quarter wave transformer 24.) Thus, the carrier amplifier 23 compresses and reaches peak efficiency at half of its maximum power. The second or peak amplifier becomes active only during the peaks of the input signal. When the peak amplifier is active, the load impedance apparent at the output of the carrier amplifier 23 is reduced. High efficiency can again be achieved when the peak amplifier 26 outputs its full power. Thus, the carrier amplifier 23 is kept on the verge of saturation for a 6 dB range of output power and near-peak efficiency may be maintained.

When the input RF power into the Doherty amplifier circuit is not sufficient to turn on the peak amplifier 26, substantially all of the output power is supplied by the carrier amplifier 23. When the peak amplifier 26 is off, its output impedance is very high and the output power of the carrier amplifier 23 is essentially all delivered to the load R/2. As discussed above, the load actually presented to the carrier amplifier across the quarter-wave transformer 24 is 2R. The device current is therefore one-half of what is delivered at maximum power while the voltage is saturated. This results in the device delivering half its maximum output power. Since both the RF and DC components of the current are half their peak values, the efficiency will be at its maximum with half of the maximum output power of the carrier amplifier being supplied to the load with maximum linear efficiency.

When sufficient input RF power is provided to allow the peak amplifier 26 to become saturated, the two parallel amplifiers are evenly delivering maximum output power to the load R/2. The load apparent to each amplifier is then the optimum load R, and the load at both ends of the quarter-wave transformer 24 will remain at R. The peak amplifier 26 is designed to begin operation when the carrier amplifier 23 just begins to saturate, which may provide the highest linear efficiency. As the input RF drive is further increased, the peak amplifier begins to turn on and deliver output power to the load. The additional current supplied by the peak amplifier 26 has the effect of increasing the load impedance at the output of the quarter-wave transformer 24. The effective change at the carrier amplifier end of the transformer 24 will be a reduction in the apparent load impedance and enabling the carrier amplifier 23 to deliver more power while its voltage remains saturated. The efficiency between the limits will fall off only slightly from the maximum since the duty factor of the peak amplifier is relatively low.

Some efforts have been made to extend the range over which the output power and near-peak efficiency of a Doherty amplifier can be maintained. For example, U.S. Pat. No. 6,791,417, entitled "N-Way RF Power Amplifier Circuit With Increased Back-Off Capability And Power Added Efficiency Using Selected Phase Lengths And Output Impedances," discloses a Doherty amplifier with multiple peak amplifiers. A four-way Doherty amplifier circuit 30 is illustrated in FIG. 1B. As shown therein, a carrier amplifier 33 and the three peak amplifiers 36A-C are provided, with the peak amplifiers 36A-C connected through 90° transformers 35A-C to an output load 38. A single 90° transformer 34 connects a four-way splitter 32 to the carrier amplifier 34. By setting the DC bias on each of the peak amplifiers 36A-C to appropriate values, the added peak amplifiers allow the Doherty action to be extended. The outputs of carrier amplifier 33 and peak amplifiers 36A-C are combined at combining node 37. For each peak amplifier that is added above the first, there will be a corresponding increase of 6 dB in the power range over which the peak efficiency will be maintained. Some limitation in efficiency will result due to the finite loss in the N-way splitter. The four-way amplifier extends the range of efficient power to a theoretical value of 18 dB. The four-way configuration can provide an overall power increase of 3 dBm compared to a two-way Doherty amplifier circuit. Thus, a 120 watt peak amplifier can be provided by a four-way Doherty arrangement with each path (a carrier and three peak amplifiers) utilizing 30 watt transistors.

Although the use of separate carrier and peak amplifiers in Doherty amplifiers can provide increased efficiency, they may have an insufficient power range for some applications. Moreover, the circuit components, including the splitters, quarter wave transformers, and combiners, may restrict the amplifier's net bandwidth, efficiency, and/or gain flatness over a desired range of power levels and/or operating frequencies.

SUMMARY

A power amplifier circuit according to some embodiments includes a power splitter that splits an input signal into a plurality of component input signals. At least two sets of transistor amplifiers are each coupled in parallel to the power splitter to receive and amplify different ones of the component input signals to generate amplified component output signals. The transistor amplifiers of each set of transistor amplifiers are configured to turn on at different power levels of the input signal relative to each other. A combiner is configured to receive and combine the amplified component output signals from the at least two sets of transistor amplifiers into an output signal. An integrated circuit package combines the power splitter, the at least two sets of transistor amplifiers, and the combiner.

Because the transistor amplifiers are manufactured within a common integrated circuit package, they may be formed in close proximity to one another, which can allow a plurality of the sets of transistor amplifiers to be formed in a relatively small integrated circuit package to increase the maximum output power therefrom. Moreover, tight control may be maintained over their respected amplification path characteristics during manufacturing so as to minimize any output phase differences therebetween and/or to provide increased gain flatness over a desired range of power levels and/or operating frequencies.

The integrated circuit package may enclose a plurality of substrate die and a mounting substrate. Each of the transistor amplifiers may be on a different one of the substrate die. The mounting substrate can have a major surface mounted to the power splitter, each of the substrate die, and the combiner.

The combiner may include a plurality of spiral transmission lines. Each of the spiral transmission lines can be coupled at a proximate end to a different one of the transistor amplifiers to conduct the amplified component output signal therefrom along a spiraling path to a common output node that couples together distal ends of each of the transmission lines.

Each of the transistor amplifiers can include a field effect transistor circuit having a gate terminal, a drain terminal, and a source terminal. The drain terminals of each of the transistor amplifiers may be coupled to a same voltage signal. The power amplifier circuit may include a drain voltage modulator that modulates a voltage of the transistor drain terminals in response to an amplitude of a component of the input signal.

The power amplifier circuit may further include a quadrature amplitude modulator that multiplies a communication signal by a higher frequency carrier signal to generate an in-phase signal, that phase delays the carrier signal a quarter wavelength to generate a delayed carrier signal, and that multiplies the communication signal by the delayed carrier signal to generate an out-of-phase signal. The power splitter can be coupled to the quadrature amplitude modulator to receive and split the out-of-phase signal. The drain voltage modulator can modulate the voltage of the drain terminals to track an envelope of the in-phase signal.

In some other embodiments, a power amplifier circuit includes a power splitter, at least two sets of a peak transistor amplifier and a carrier transistor amplifier, and a combiner. The peak transistor amplifiers and the carrier transistor amplifiers are coupled in parallel to the power splitter to receive and amplify different ones of the component input signals to generate amplified component output signals. The peak transistor amplifiers are configured to turn on when the component input signals reach a threshold that saturates the carrier amplifiers. The combiner is configured to receive and combine the amplified component output signals from the at least two sets of transistor amplifiers into an output signal. The integrated circuit package encloses the power splitter, the at least two sets of transistor amplifiers, and the combiner.

The carrier transistor amplifiers may be biased for operation in Class A/B, and the peak transistor amplifiers may be biased for operation in Class C.

A drain voltage modulator may generate a voltage signal having an amplitude that is modulated in response to an amplitude of a component of the input signal. Each of the peak transistor amplifiers and the carrier transistor amplifiers may include a field effect transistor circuit having a gate terminal, a drain terminal, and a source terminal. The drain terminals may be coupled to receive the voltage signal from the drain voltage modulator.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1A:
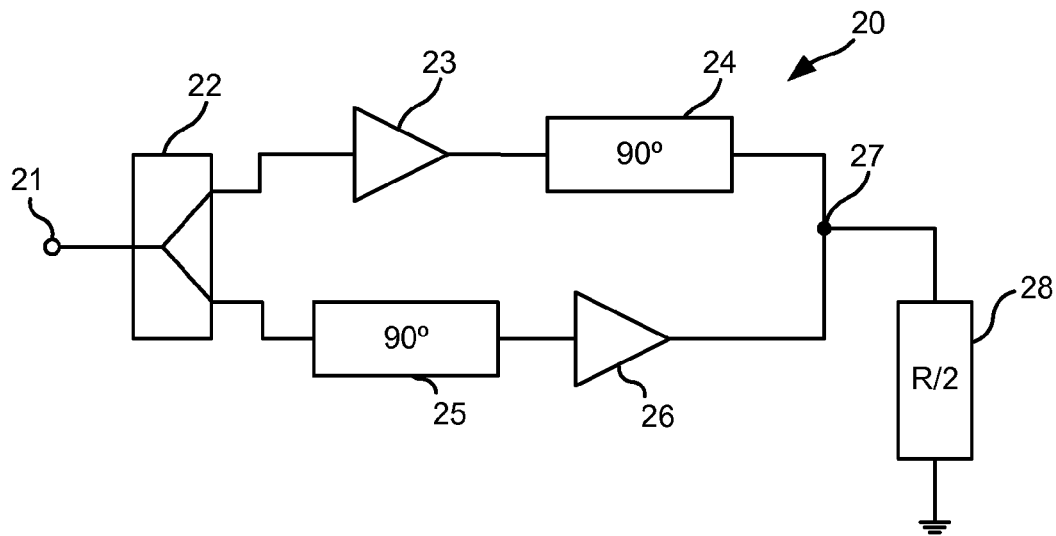
FIGS. 1A-1B illustrate various configurations of Doherty amplifiers.

Embodiments of the present invention will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of regions may be exaggerated for clarity. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Some embodiments of the present invention are directed to an integrated circuit power amplifier that includes a plurality of sets of transistor amplifiers that are coupled in parallel to receive and amplify components of an input signal. The two transistor amplifiers within each set of transistor amplifiers are configured to turn on at different power levels of the input signal relative to each other. The sets of transistor amplifiers in some embodiments are not configured in a Doherty amplifier arrangement because their outputs are not combined at a combining node while the sets of transistor amplifiers in some other embodiments are configured in a Doherty amplifier arrangement.

Because the transistor amplifiers are manufactured within a common integrated circuit package, they may be formed in close proximity to one another, which can allow a plurality of the sets of transistor amplifiers to be formed in a relatively small integrated circuit package to increase the maximum output power therefrom. Moreover, tight control may be maintained over their respected amplification path characteristics during manufacturing so as to minimize any output phase differences there between and/or to provide increased gain flatness over a desired range of power levels and/or operating frequencies.

Figure 2:
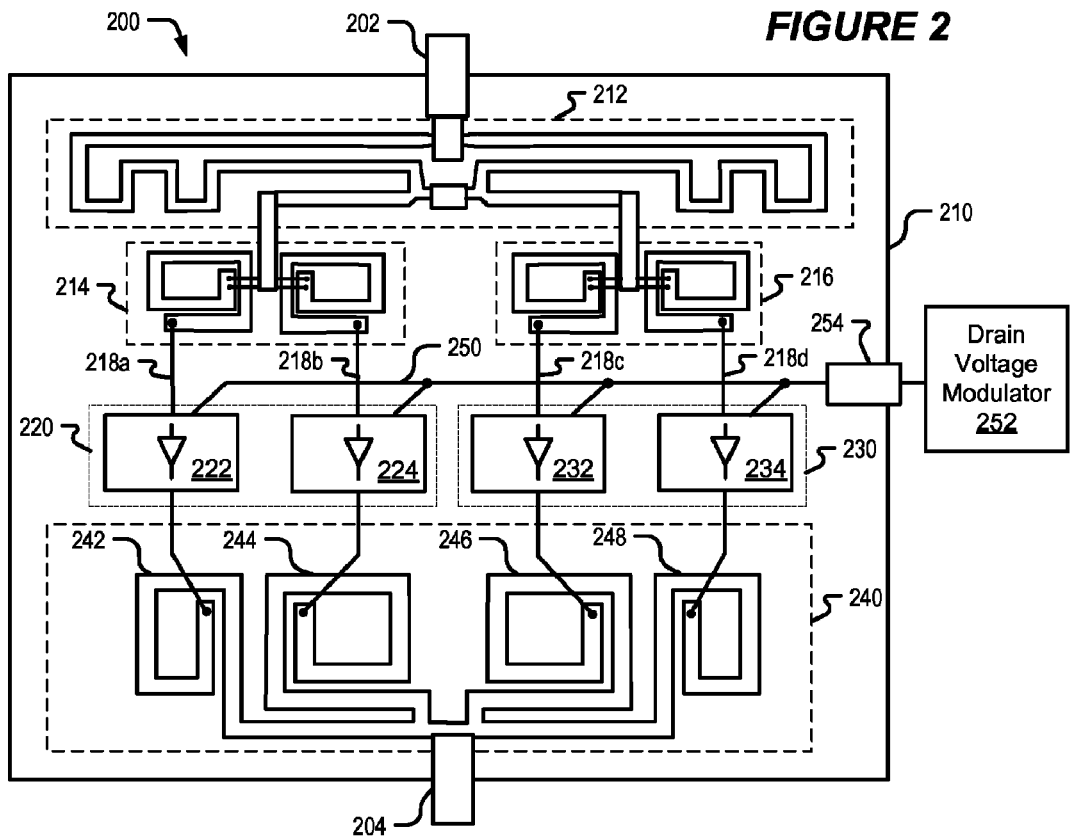
FIG. 2 is a schematic circuit diagram of an integrated circuit power amplifier with two sets of transistor amplifiers having different turn on power levels and which are connected in parallel between a power splitter and combiner according to some embodiments.
Figure 3:
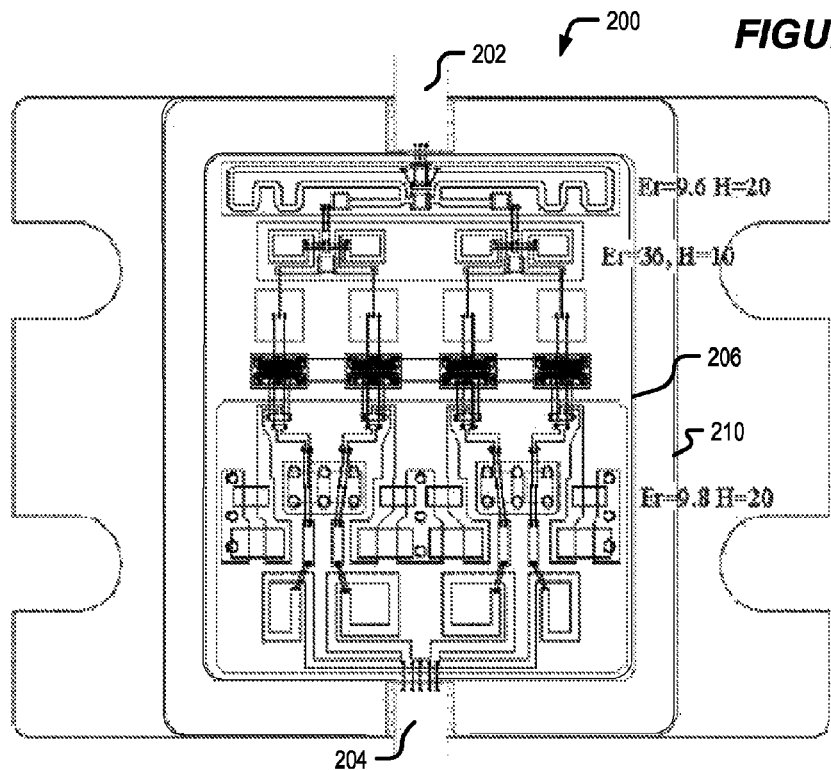
FIG. 3 is a chip layout schematic of a further exemplary embodiments of the power amplifier circuit within the integrated circuit package of FIG. 2.

A power amplifier integrated circuit according to some embodiments is shown in FIGS. 2 and 3. FIG. 2 is a schematic circuit diagram of an integrated circuit power amplifier 200, and FIG. 3 is a more detailed chip layout schematic showing additional circuit components of the integrated circuit power amplifier 200 of FIG. 2 according to some embodiments.

Referring to FIG. 2, the power amplifier circuit includes an integrated circuit package 210 that receives an input signal for amplification through at least one input pin 202 and outputs the amplified signal through at least one output pin 204. A power splitter splits the input signal from pin 202 into a plurality of component input signals.

In the exemplary embodiment, a two stage power splitter includes a first stage two-way power splitter 212 that splits the input signal into two component input signals, and a second stage having two more two-way power splitters 214 and 216 connected to the respective output nodes of the power splitter 212. The power splitters 214 and 216 further split the two component input signals into four component input signals. Accordingly, the input signal from pin 202 is split into four component input signals 218a-d. The input signal at pin 202 may be equally or unequally split between the four component input signals 218a-d by balancing or asymmetrically configuring the relative impedances of the transmission paths through the splitters 212, 214, and 216.

Two sets of transistor amplifiers 220 and 230 are each coupled in parallel to the power splitter to receive and amplify different ones of the component input signals to generate amplified component output signals. The two transistor amplifiers of each set of transistor amplifiers 220 and 230 are configured to turn on at different power levels of the input signal 202 relative to each other. As shown in FIG. 2, one set of transistor amplifiers 220 includes a first transistor amplifier 222 that is coupled to one output of the power splitter 214 to receive and amplify the component input signal 218a, and a second transistor amplifier 224 that is coupled to the other output of the power splitter 214 to receive and amplify the component input signal 218b. The second transistor amplifier 224 is biased to turn on at a different power level of the input signal than the first transistor amplifier 222.

Figure 1B:
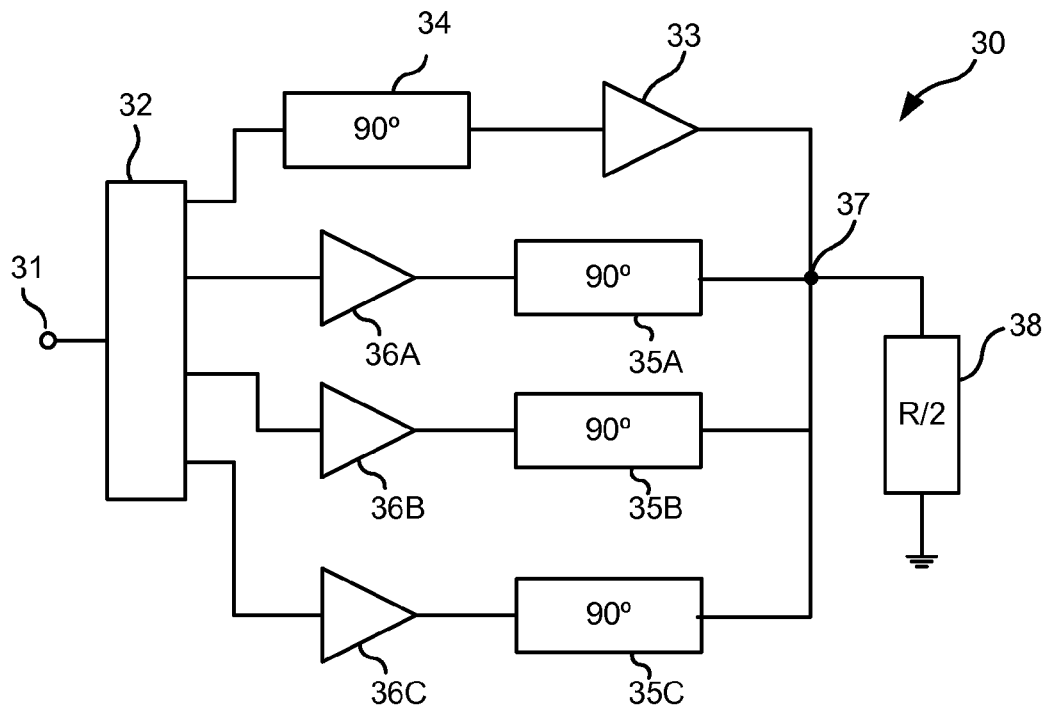

Although only two sets of transistor amplifiers have been shown in FIGS. 2 and 3 for purposes of illustration and explanation, the invention is not limited thereto. Various embodiments of the present invention may instead include two or more sets of transistor amplifiers. Moreover, although the exemplary transistor amplifier sets are illustrated as each having two transistor amplifiers, they are not limited thereto and may instead each have two or more transistor amplifiers (e.g., as shown in FIG. 1B).

The first transistor amplifier 222 may be biased to operate as a carrier amplifier that may operate up to a nearly peak level of the input signal and to saturate at higher levels. The second transistor amplifier 224 may be biased to operate as a peak amplifier that turns on (becomes active) only during levels associated with peaks of the input signal. The first and second transistor amplifiers 222 and 224 may both be biased to operate in Class A/B, or the second transistor amplifier 224 may be biased to operate in Class C to provide increased amplification efficiency at peak levels of the input signal.

The other set of transistor amplifiers 230 includes a third transistor amplifier 232 that is coupled to one output of the power splitter 216 to receive and amplify the component input signal 218c, and a fourth transistor amplifier 234 that is coupled to the other output of the power splitter 216 to receive and amplify the component input signal 218d. The fourth transistor amplifier 234 is biased to turn on at a different power level of the input signal than the third transistor amplifier 232. The third transistor amplifier 232 may be configured to operate in the same manner as the first transistor amplifier 222, and the fourth transistor amplifier 234 may be configured to operate in the same manner as the second transistor amplifier 224. Accordingly, the third transistor amplifier 232 may be biased to turn on at the same power level of the input signal as the first transistor amplifier 222, and the fourth transistor amplifier 234 may be biased to turn on a same level of input signal as the second transistor amplifier 224.

A combiner 240 receives and combines the amplified component output signals from the transistor amplifiers sets 220 and 230 into an output signal that is coupled to the output pin 204. The combiner 240 may include a plurality of spiral transmission lines 242, 244, 246, and 248. Each of the transmission lines 242, 244, 246, and 248 can be coupled at a proximate end to a different one of the transistor amplifiers 222, 224, 232, and 234 to conduct the amplified component output signals therefrom along a spiraling path to a common output node that couples together distal ends of each of the transmission lines 242, 244, 246, and 248 to the output pin 204. Using spiral transmission lines to couple the transistor amplifiers to the output pin 204 may reduce the surface area of the mounting substrate 210 that is used by the combiner 240 and, relatedly, may allow fabrication of a smaller integrated circuit 200 and/or inclusion of further amplifier circuitry, such as additional sets of amplifier transistors.

The path length and width of the each of the spiral transmission lines can be defined to match impedance levels of the output of the transistor amplifiers to an output load connected to the output pin 204. For example, the length and width of the spiral transmission lines may be defined to present a 50Ω resistance at the output pin 204. The spiral transmission lines 242, 244, 246, and 248 of the combiner 240 may have the same transmission path length to avoid introducing phase shifts between the amplified component output signals that are combined at the output pin 204.

The path length and width of each of the spiral transmission lines 242, 244, 246, and 248 can be defined to match an impedance level at an output of a respective one of the transistor amplifiers 222, 224, 232, and 234 to an impedance level at the common output node of pin 204 when that spiral transmission line is carrying a respective one of the amplified component output signals 218a-d including a second harmonic frequency component of the input signal from pin 202. This may provide increased amplification efficiency over a wider frequency bandwidth.

As shown in FIG. 2, the spiral transmission lines 242, 244, 246, and 248 can be fabricated in close proximity to one another on the mounting substrate 210. The signals transmitted through each of the spiral transmission lines generate electromagnetic effects that may undesirably change the operational impedance levels of the other adjacent spiral transmission lines, with the extent of those changes being related to their relative proximity to each other. Accordingly, the inner two spiral transmission lines 244 and 246 can have a greater impedance increase compared to the outer two spiral transmission lines 242 and 248 due to the combined electromagnetic effects of the proximately located spiral transmission lines. This asymmetrical electromagnetic effect on spiral transmission line impedance may be at least partially compensated for by lengthening the transmission path of the outer two spiral transmission lines 242 and 248 by an amount that results in them having impedances that substantial match the impedances of the inner two spiral transmission lines 244 and 246 when transmitting a characteristic signal.

When the spiral transmission lines 242, 244, 246, and 248 are formed on the same mounting substrate 206 as the power splitters 212, 214, and 216 and the transistor amplifier sets 220 and 230, the integrated circuit manufacturing processes may be controlled to accurately form desired transmission lengths and widths for the spiral transmission lines 242, 244, 246, and 248 and the power splitters 212, 214, and 216.

The splitters and combiners may be formed on the same or different dielectric constant materials of the substrate 206. Referring to FIG. 3, in some embodiments, the transmission lines of the power splitter 212 include a set of transmission lines that extend away from a common input node that receives the input signal. The transmission lines of the power splitter 212 may be formed on a material having a dielectric constant of 9.6 $\epsilon_r$ and a thickness of 0.5 mm. In contrast, the transmission lines of the power splitters 214 and 216 may be formed on a material having a dielectric constant of 36 $\epsilon_r$ and a thickness of 0.25 μm, and the spiral transmission lines 242, 244, 246, and 248 of the combiner 240 may be formed on a material having a dielectric constant of 9.8 $\epsilon_r$ and a thickness of 0.5 μm.

Although these exemplary dielectric constants and thicknesses of respective dielectric areas of the substrate 206 may provide improved operational characteristics and/or more compact layout of the device features on the substrate 206, it is to be understood that the invention is not limited thereto and, instead, the transmission lines may be formed on a uniform dielectric material or differing dielectric materials may be used to provide desired impedances along the different transmission paths.

The integrated circuit package 210 encloses (combines) the power splitters 212, 214, and 216, the transistor amplifier sets 220 and 230, the combiner 240, and the substrate 206.

Each of the first, second, third, and fourth transistor amplifiers 222, 224, 232, and 234 may be on a different substrate die (e.g., the illustrated separate blocks of each amplifier), with the separate dies being mounted to a same major surface of the substrate 206 on which the power splitters 212, 214, and 216 can also be formed.

Figure 4:
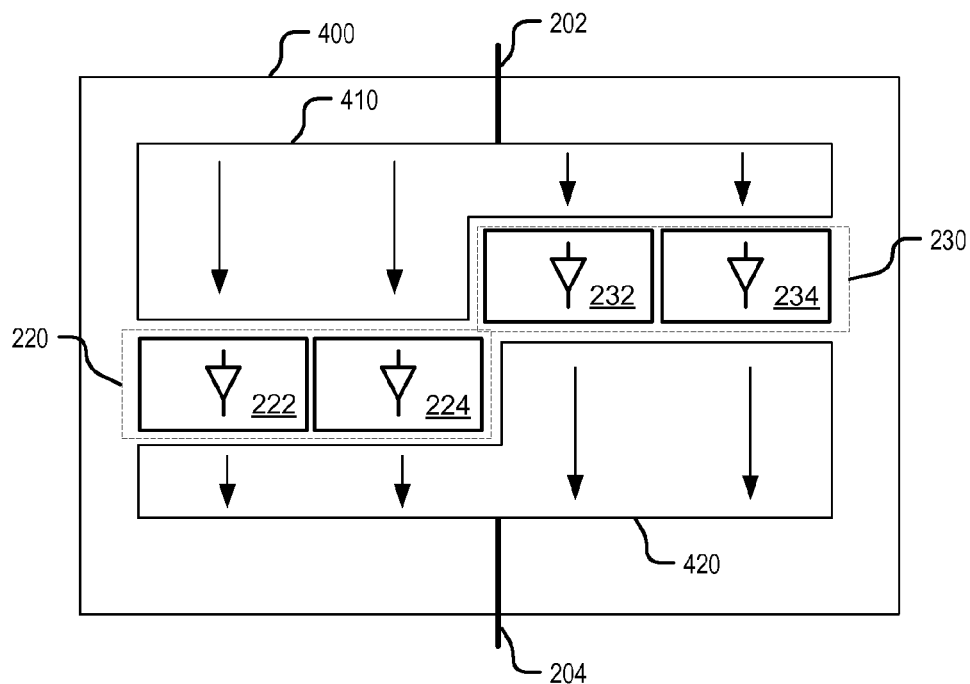
FIG. 4 is a schematic circuit diagram of two offset sets of transistor amplifiers on a common substrate and which are connected between a power splitter and a combiner having opposite symmetrical different length transmission paths there through according to some embodiments.

Alternatively, the first, second, third, and fourth transistor amplifiers 222, 224, 232, and 234 may be formed on a common substrate die. FIG. 4 is a schematic circuit diagram of two offset sets of transistor amplifiers on a common substrate 400 and which are connected between a power splitter 410 and a combiner 420. To reduce the amount of surface area on the substrate 400 that is used to fabricate the transistor amplifiers 222, 224, 232, and 234, the sets of transistor amplifiers 220 and 230 may be formed on the substrate offset relative to each other.

Accordingly, as shown in FIG. 4, the transmission path from the input pin 202 through the power splitter 410 to the transistor amplifier set 220 is a defined first distance longer than a transmission path from the input pin 202 through the power splitter 410 to the other transistor amplifier set 230. Similarly, the transmission path from the transistor amplifier set 230 through the combiner 420 to the output pin 204 is a defined distance longer than a transmission path from the transistor amplifier set 220 through the combiner 420 to the output pin 204. To reduce/prevent undesirable phase differences between the amplified component output signals that are combined at output pin 204, the transmission path from the transistor amplifier set 230 through the combiner 420 to the output pin 204 can be the same defined first distance longer than the transmission path from the transistor amplifier set 220 through the combiner 420 to the output pin 204.

Accordingly, the relative phase shift between the component input signals that are supplied to the transistor amplifier sets 220 and 230, due to the offset transistor amplifier set 230 being closer to the input pin 202, may be reversed and, thereby, cancelled, by extending the transmission path from the transistor amplifier set 230 through the combiner 420 so that the same length transmission paths are provided from the input pin 202 to the output pin 204 through the transistor amplifier sets 220 and 230.

With reference again to FIGS. 2 and 3, the transistor amplifiers 222, 224, 232, and 234 may be configured as RF field effect transistors (FET) having a gate terminal, a drain terminal, and a source terminal. The transistor amplifiers 222, 224, 232, and 234 may be formed from GaN-based high electron mobility transistors (HEMTs) for high output power capability (e.g., 120 W at 28V). Suitable structures for GaN-based HEMTs that may be used in embodiments of the present invention are described, for example, in commonly assigned U.S. Pat. No. 6,316,793 and U.S. Publication No. 2002/0066908A1 filed Jul. 12, 2001 and published Jun. 6, 2002, for "Aluminum Gallium Nitride/Gallium Nitride High Electron Mobility Transistors Having A Gate Contact On A Gallium Nitride Based Cap Segment And Methods Of Fabricating Same," U.S. Publication No. 2002/0167023 filed May 11, 2001 and published Nov. 14, 2002 for "Group Iii Nitride Based High Electron Mobility Transistor (HEMT) With Barrier/Spacer Layer," United States Publication No. 2002/0167023A1 to Smorchkova et al., published Nov. 14, 2002, entitled "Group-Iii Nitride Based High Electron Mobility Transistor (HEMT) With Barrier/Spacer Layer" and United States Publication No. 2004/0061129 filed Jul. 11, 2003 and published Apr. 1, 2004 for "Nitride-Based Transistors And Methods Of Fabrication Thereof Using Non-Etched Contact Recesses," the disclosures of which are hereby incorporated herein by reference in their entirety. Other types of transistors, such as silicon LDMOS, silicon carbide MESFET, GaAs HEMT and/or SiGe HBTs can be used.

The transistor amplifiers 222, 224, 232, and 234 may be equally sized (i.e. may have the same gate width, etc.). However, in some embodiments, the transistors can have different gate widths, which can provide enhanced backoff efficiency and/or amplifier gain. For example, the transistor amplifiers 222 and 232 can have a shorter gate width compared to the transistor amplifiers 224 and 234. Thus, the transistor amplifiers 224 and 234, which can be biased to turn on at higher power levels, can be capable of generating higher output power under higher input power conditions.

Drain terminals of each of the transistor amplifiers 222, 224, 232, and 234 can be coupled to the same drain voltage signal 250. In some embodiments, a drain voltage modulator 252 controls the drain voltage signal 250. The drain voltage modulator 252 may regulate an amplitude of the drain voltage signal 250 in response to an amplitude of a component of the input signal (such as responsive to an amplitude of the input signal from pin 202). The drain voltage modulator 252 may be coupled to the drain voltage signal 250 through a drain voltage pin 254 on the integrated circuit package 210. Modulating the drain voltage of the transistor amplifiers in this manner may increase efficiency of the integrated circuit power amplifier 200 over a greater operational power and/or frequency range of the input signal.

An integrated circuit power amplifier that is configured in accordance with various embodiments of the present invention may be used to amplify communication signals for transmission from base stations of a cellular communication systems. Some embodiments of the invention may be useful in high-efficiency communication power amplifiers for both narrow and wide band communication applications, such as CDMA, W-CDMA, WiMax, etc., using a number of different modulation schemes, such as FM, QPSK, QAM, etc.

Figure 5:
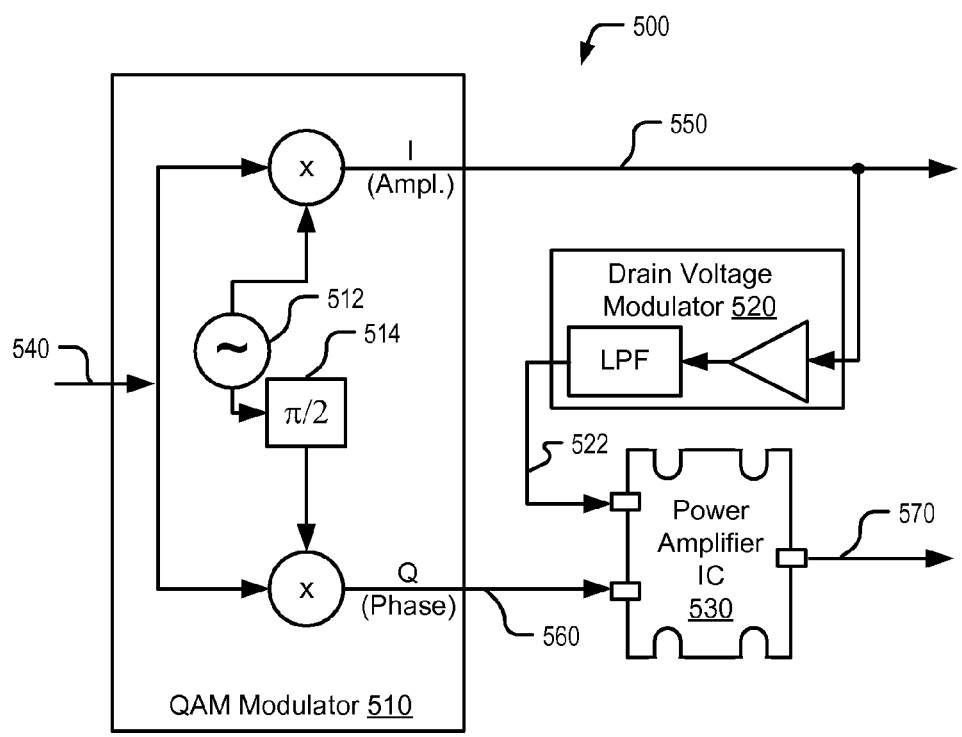
FIG. 5 is a schematic circuit diagram of a quadrature amplitude modulator, a drain voltage modulator, and a power amplifier integrated circuit according to some embodiments.

FIG. 5 is a schematic circuit diagram of a portion of a RF transmitter 500 for a cellular base station. The RF transmitter 500 includes a quadrature amplitude (QAM) modulator 510, a drain voltage modulator 520, and an integrated circuit power amplifier 530. The integrated circuit power amplifier 530 may be configured according to various of the embodiments described above with regard to FIGS. 2 and 3.

The QAM modulator 510 modulates (e.g., multiplies) a high frequency carrier signal (e.g., 2.1 GHz to 2.7 GHz) from a frequency synthesizer 512 by a lower frequency input communication signal 540 to generate an in-phase (amplitude component) signal 550. The QAM modulator 510 also uses a delay circuit 514 to generate a quarter wavelength delayed carrier signal which is modulated by the input communication signal 540 to generate a quadrature (phase component) signal 560. The quadrature signal 560 is amplified by the integrated circuit power amplifier 530 to generate an amplified quadrature signal 570. The quadrature signal 560 can be supplied as the input signal on input pin 202 of FIG. 2. The amplified quadrature signal 570 and the in-phase signal 550 can be further filtered and combined for transmission through an antenna.

The drain voltage modulator 520 generates a drain voltage signal 522 that is varied to track changes to the envelope of the in-phase signal 550. The drain voltage signal controls the drain voltage of the drain terminals of each of the transistor amplifiers, such as the transistor amplifiers 222, 224, 232, and 234 (shown in FIG. 2) of the integrated circuit power amplifier 530. Accordingly, in some embodiments, the drain voltage modulator 520 can decrease the drain voltage of the transistor amplifiers in response to decreased amplitude of the in-phase signal 550 and can increase the drain voltage of the transistor amplifiers in response to increased amplitude of the in-phase signal 550. Modulating the drain voltage of the transistor amplifiers in this manner may increase efficiency of the integrated circuit power amplifier 530 over a greater operational range of the input communication signal 540.

Figure 6:
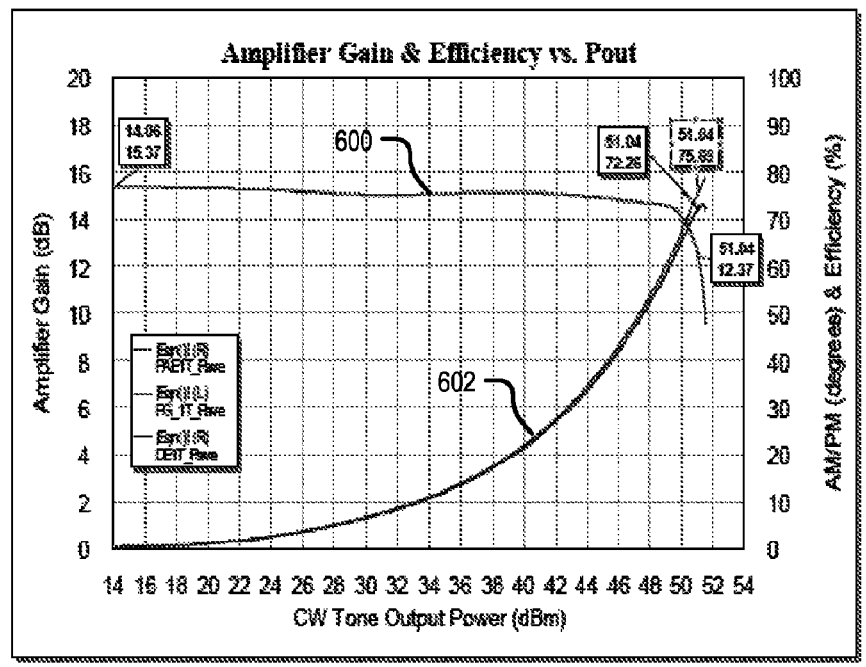
FIG. 6 is a graph of simulation results illustrating power gain and efficiency versus output power during operation of an integrated circuit power amplifier according to some embodiments.

FIG. 6 is a graph of simulation results illustrating power gain and efficiency versus output power level during operation of an integrated circuit power amplifier at input signal frequency of 2.4 GHz according to some embodiments. The curve 600 illustrates the amplified gain of the power amplifier and the curve 602 illustrates efficiency of the power amplifier over a range of output power levels. Referring to curve 600, the amplified gain is relatively constant over a wide range of output power. Referring to curve 602, the exemplary power amplifier obtains about a 37% efficiency when the output power is backed off 6 dB from a peak power level, where the 6 dB backed off level may be a typical operational power level for a power amplifier that is amplifying CDMA communication signals for transmission. This 37% efficiency is much higher than a 20% to 25% maximum efficiency that is obtainable by at least some prior art power amplifiers that are operating at a 6 dB backed off power level.

Figure 7:
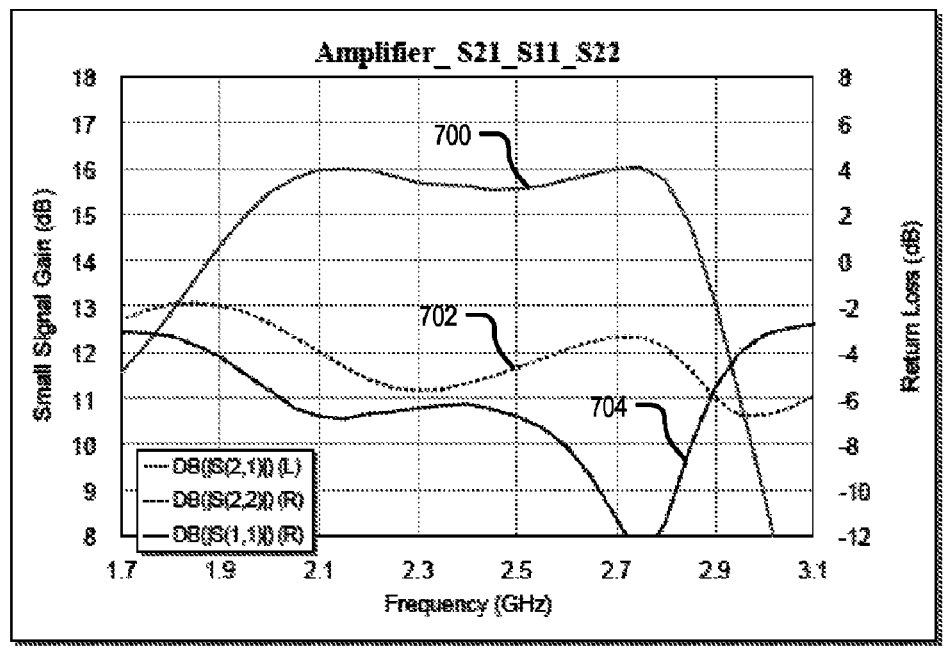
FIG. 7 is a graph of simulation results illustrating small signal gain and return loss versus frequency during operation of an integrated circuit power amplifier according to some embodiments.

FIG. 7 is a graph of simulation results illustrating small signal gain and return loss versus frequency during operation of a power amplifier integrated circuit according to some embodiments. The curve 700 illustrates the small signal gain, the curve 702 illustrates the input return loss, and the curve 704 illustrates the output return loss versus frequency. Referring to curve 700, the gain is relatively constant across a wide frequency range of about 2 to 2.8 GHz. This flat gain across that frequency range may be significant because the 2.1 GHz frequency is used by cellular communication systems in North America and Europe, the 2.3 GHz frequency is used by cellular communication systems in Korea, the 2.5 and 2.6 GHz frequencies are used by cellular communication systems in North America, and the 2.7 GHz frequency is used by cellular communication systems in Europe. Accordingly, the exemplary power amplifier can be used to amplify communication signal across all of those communication frequencies without requiring design changes. Referring to curves 702 and 704, it is observed that the power amplifier is closely matched to the output load impedance across most of the illustrated frequency range.

Figure 8:
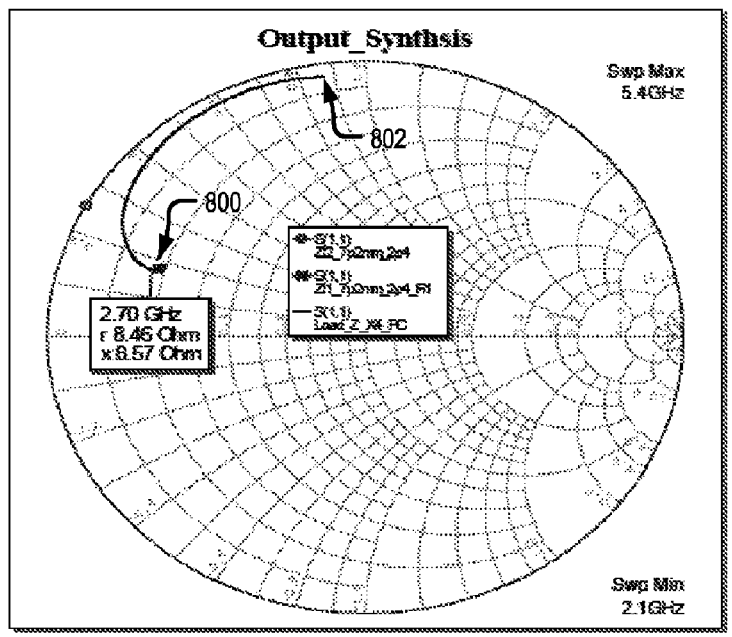
FIG. 8 is a graph of simulation results illustrating output impedance matching to a load during operation of an integrated circuit power amplifier according to some embodiments.

FIG. 8 is a graph of simulation results illustrating output impedance matching to a load during operation of a power amplifier integrated circuit according to some embodiments. The point 800 on illustrated curve corresponds to the impedance that the transistor amplifiers should see at their output to provide maximum efficiency for output power. The point 802 on illustrated curve shows a second harmonic impedance that should be terminated by the transistor amplifiers.

Figure 9:
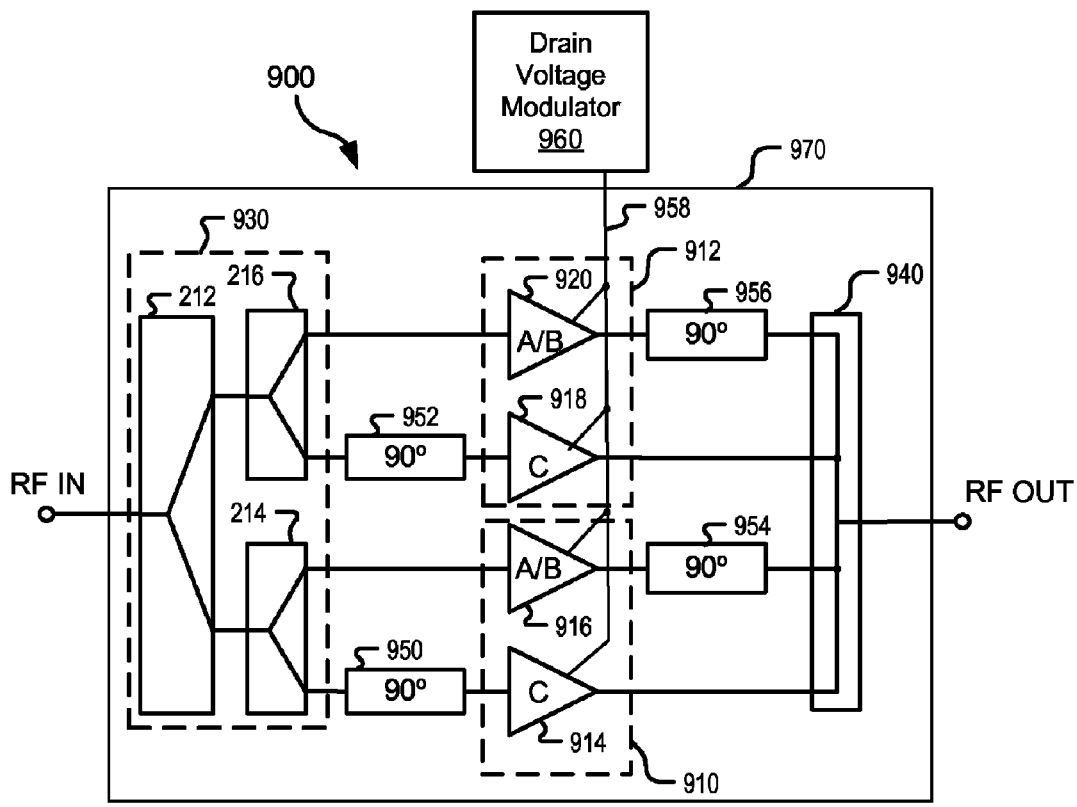
FIG. 9 is a schematic circuit diagram of an integrated circuit power amplifier with two sets of Doherty configured transistor amplifiers having different turn on power levels and which are connected in parallel between a power splitter and combiner according to some embodiments.

An integrated circuit power amplifier that is configured according to some other embodiments is in shown in FIG. 9. FIG. 9 is a schematic circuit diagram of an integrated circuit power amplifier 900 having two sets of Doherty configured transistor amplifiers 910 and 912 which are connected in parallel between a power splitter 930 and combiner 940. The transistor amplifiers within each transistor amplifier set are configured to turn on at different power levels.

The power splitter 930 may be configured as shown in FIGS. 2 and 3 to split an input signal RF IN using the two stages of two-way splitters 212, 214, and 216 to generate four component input signals.

The transistor amplifier set 910 can include a peak transistor amplifier 914 and a carrier transistor amplifier 916. The carrier transistor amplifier 916 can be biased to operate as a Class A/B amplifier which may operate linearly up to a nearly peak level of the component input signal and to saturate at higher levels. In contrast, the peak transistor amplifier 914 can be biased to turn on only during levels associated with peaks of the component input signal that saturates the carrier transistor amplifier 916. The other transistor amplifier set 912 can similarly include a peak transistor amplifier 918 and a carrier transistor amplifier 920 the can be biased to operate in a similar manner to the peak and carrier transistor amplifiers 914 and 916, respectively.

A 90° impedance matching transformer 950 delays the component input signal by a quarter wavelength before it is input to the peak amplifier 914. Another 90° impedance matching transformer 952 similarly delays another component input signal by a quarter wavelength before it is input to the peak amplifier 918. The amplified component output signal from the carrier amplifier 916 is delayed a quarter wavelength by another 90° impedance matching transformer 954, and the amplified component output signal from the carrier amplifier 920 is similarly delayed a quarter wavelength by another 90° impedance matching transformer 956. It will be appreciated that the term "transformer" is used herein in a general sense to include any reactive components that can change the phase of an input signal, and can include, for example, a transmission line.

A combining node 940 receives and combines the amplified component output signals to generate an output signal RF OUT.

Drain terminals of each of the transistor amplifiers 914, 916, 918, and 920 can be coupled to the same drain voltage signal 958. In some embodiments, a drain voltage modulator 960 controls the drain voltage signal 958. The drain voltage modulator 960 may regulate an amplitude of the drain voltage signal 958 in response to an amplitude of a component of the input signal RF IN, such as in the manner explained above for the drain voltage modulator 252 of FIG. 2. Modulating the drain voltage of the transistor amplifiers in this manner may increase efficiency of the integrated circuit power amplifier 900 over a greater operational range of the input signal RF IN.

The power splitter 930, the transformers 950, 952, 954, and 956, the transistor amplifier sets 910 and 912, and the combining node 940 may be enclosed within an integrated circuit package 970. Because the transistor amplifiers are manufactured within a common integrated circuit package, they may be formed in close proximity to one another, which can allow a plurality of the sets of transistor amplifiers be formed in a relatively small package and/or to may allow use of more transistor amplifier sets to increase their combined power range. Moreover, tight control may be maintained over the characteristics of the transmission paths through the power splitter 930 and the combining node 940 during manufacturing so as to minimize any output phase differences there between and/or to provide increased gain flatness over a power level and/or operating frequencies.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A power amplifier circuit, comprising:
a power splitter configured to split an input signal into a plurality of component input signals, wherein the power splitter comprises a first stage splitter that splits the input signal into at least two first stage component output signals and at least two second stage splitters that each split at least one of the first stage component output signals into at least two second stage component output signals, and the first stage splitter is on a dielectric material having a first dielectric constant and the at least two second stage slitters are on another dielectric material having a second dielectric constant that is different than the first dielectric constant;
at least two sets of transistor amplifiers that are connected to the power splitter to receive and amplify different ones of the second stage component output signals to generate amplified component output signals; and
a combiner configured to receive and combine the amplified component output signals from the at least two sets of transistor amplifiers into an output signal.

2. The power amplifier circuit of claim 1, wherein the at least two sets of transistor amplifiers comprise:
a first transistor amplifier coupled to the power splitter to receive and amplify a first one of the second stage component output signals;
a second transistor amplifier coupled to the power splitter to receive and amplify a second one of the second stage component output signals, wherein the second transistor amplifier is configured to turn on at a different power level of the second stage component output signal than the first transistor amplifier;

a third transistor amplifier coupled to the power splitter to receive and amplify a third one of the second stage component output signals, wherein the third transistor amplifier is configured to turn on at a same power level of the second stage component output signal as the first transistor amplifier; and a fourth transistor amplifier coupled to the power splitter to receive and amplify a fourth one of the second stage component output signals, wherein the fourth transistor amplifier is configured to turn on at a same power level of the second stage component output signals as the second transistor amplifier.

3. The power amplifier circuit of claim 1, further comprising:

a plurality of substrate die, wherein each of the transistor amplifiers are on a different one of the substrate die; and a mounting substrate having a major surface mounted to the power splitter, each of the substrate die, and the combiner;

an integrated circuit package that encloses the power splitter, the at least two sets of transistor amplifiers, the combiner, and the mounting substrate.

4. The power amplifier circuit of claim 1, wherein:

a transmission path from an input node through the first stage splitter and one of the second stage splitters to a first one of the sets of transistor amplifiers is a defined distance longer than a transmission path from the input node through the first stage and another of the second stage splitters to a second one of the sets of transistor amplifiers; and a transmission path from the second one of the sets of transistor amplifiers through the combiner to an output node is the defined distance longer than the transmission path from the first one of the sets of transistor amplifiers through the combiner to the output node.

5. The power amplifier circuit of claim 1, wherein:

one of the transistor amplifiers in each set of transistor amplifiers is biased for operation in Class A/B; and the other one of the transistor amplifiers in each set of transistor amplifiers is biased for operation in Class C.

6. The power amplifier circuit of claim 1, wherein:

the at least two sets of transistor amplifiers are each coupled in parallel to each other and coupled in series to the power splitter to receive and amplify different ones of the component input signals to generate the amplified component output signals; and the transistor amplifiers of each set of transistor amplifiers are configured to turn on at different power levels of the input signal relative to each other.

7. A power amplifier circuit, comprising:

a power splitter configured to split an input signal into a plurality of component output signals;

at least two sets of transistor amplifiers connected to the power splitter to receive and amplify at least one of the component output signals to generate amplified component output signals; and a combiner configured to receive and combine the amplified component output signals from the at least two sets of transistor amplifiers into an output signal, wherein the combiner comprises a plurality of spiral transmission lines, each of the spiral transmission lines is coupled at a proximate end to a different one of the transistor amplifiers to conduct the amplified component output signal therefrom along a spiraling path to a common output node that couples together distal ends of each of the transmission lines.

8. The power amplifier circuit of claim 7, wherein the spiral transmission lines each have the same path length.

9. The power amplifier circuit of claim 7, wherein the path length of the each of the spiral transmission lines is defined to match impedance levels of an output of a respective one of the transistor amplifiers and an output load.

10. The power amplifier circuit of claim 9, wherein the path length of each of the spiral transmission lines is defined to match an impedance level at an output of a respective one of the transistor amplifiers to an impedance level at the common output node when that spiral transmission line is carrying a respective one of the amplified component output signals including a second harmonic frequency component of the input signal.

11. The power amplifier circuit of claim 7, wherein:

spiral portions of four of the spiral transmission lines are arranged along a row in a first, second, third, and fourth sequential order; and the path length of first and fourth spiral transmission lines is longer than the path length of the second and third spiral transmission lines to compensate for electromagnetic effects of the first and fourth spiral transmission lines on the operational impedance of the second and third spiral transmission lines.

12. The power amplifier circuit of claim 7, wherein:

the power slitter comprises a first stage splitter that splits the input signal into at least two first stage component output signals and at least two second stage splitters that each split at least one of the first stage component output signals into at least two second stage component output signals, and the first stage splitter is on a first dielectric material having a first dielectric constant, the spiral transmission lines are on a second dielectric material having a second dielectric constant that is greater than the first dielectric constant, and the at least two second stage splitters are on a third dielectric material having a third dielectric constant that is greater than the second dielectric constant.

13. The power amplifier circuit of claim 7, wherein:

the transistor amplifiers of each set of transistor amplifiers are configured to turn on at different power levels of the input signal relative to each other.

14. A power amplifier circuit, comprising:

a power splitter configured to split an input signal into a plurality of component output signals;

at least two sets of transistor amplifiers that are connected to receive and amplify at least one of the component output signals to generate amplified component output signals; and a combiner configured to receive and combine the amplified component output signals from the at least two sets of transistor amplifiers into an output signal, wherein each of the transistor amplifiers comprises a field effect transistor circuit having a gate terminal, a drain terminal, and a source terminal, and the drain terminals of each of the transistor amplifiers are coupled to a same voltage signal.

15. The power amplifier circuit of claim 14, further comprising an integrated circuit package that combines the power splitter, the at least two sets of transistor amplifiers, and the combiner, wherein a conductive line couples the drain terminals of each of the transistor amplifiers to an external pin of the integrated circuit package.

16. The power amplifier circuit of claim 14, further comprising a drain voltage modulator that generates a voltage signal having an amplitude that is modulated in response to an amplitude of a component of the input signal, wherein the drain terminals of each of the transistor amplifiers are coupled to receive the voltage signal from the drain voltage modulator.

17. The power amplifier circuit of claim 16, further comprising a quadrature amplitude modulator that is configured to multiply a communication signal by a higher frequency carrier signal to generate an in-phase signal, to phase delay the carrier signal a quarter wavelength to generate a delayed carrier signal, and to multiply the communication signal by the delayed carrier signal to generate an out-of-phase signal, wherein:
- the power splitter is coupled to the quadrature amplitude modulator to receive and split the out-of-phase signal; and
- the drain voltage modulator modulates the voltage of the drain terminals to track an envelope of the in-phase signal.

18. The power amplifier circuit of claim 14, wherein the drain voltage modulator decreases the voltage of the drain terminals in response to decreased input signal amplitude, and increases the voltage of the drain terminals in response to increased input signal amplitude.

19. The power amplifier circuit of claim 14, wherein:
- the at least two sets of transistor amplifiers are each coupled in parallel to each other and coupled in series to the power splitter to receive and amplify different ones of the component input signals to generate the amplified component output signals; and
- the transistor amplifiers of each set of transistor amplifiers are configured to turn on at different power levels of the input signal relative to each other.

20. A power amplifier circuit, comprising:
- a power splitter configured to split an input signal into a plurality of component output signals;
- at least two sets of a peak transistor amplifier and a carrier transistor amplifier that are connected to the power splitter to receive and amplify at least one of the component output signals to generate amplified component output signals;
- a combiner configured to receive and combine the amplified component output signals from the at least two sets of transistor amplifiers into an output signal; and
- a drain voltage modulator that generates a voltage signal having an amplitude that is modulated in response to an amplitude of the component output signals, wherein each of the peak transistor amplifiers and the carrier transistor amplifiers comprise a field effect transistor circuit having a gate terminal, a drain terminal, and a source terminal, and the drain terminals are coupled to receive the voltage signal from the drain voltage modulator.

21. The power amplifier circuit of claim 20, wherein:
- each of the peak transistor amplifiers receives the component output signal through a quarter-wavelength transformer; and
- each of the carrier transistor amplifiers outputs the amplified component output signal through quarter-wavelength transformer to the combiner.

22. The power amplifier circuit of claim 20, wherein:
- the carrier transistor amplifiers are biased for operation in Class A/B; and
- the peak transistor amplifiers are biased for operation in Class C.

23. A power amplifier circuit, comprising:
- a power splitter comprising a plurality of spiral transmission lines that are connected through a first end to a common node to receive a component of an output signal and to conduct the component output signal along a spiraling path to a second end;
- at least two sets of transistor amplifiers that are each connected to the second end of at least one of the spiral transmission lines to receive and amplify the component output signals to generate amplified component output signals; and
- a combiner configured to receive and combine the amplified component output signals from the at least two sets of transistor amplifiers into an output signal.

24. The power amplifier circuit of claim 23, wherein:
the spiral transmission lines of the power splitter are on a dielectric material having a first dielectric constant and the combiner is on another dielectric material having a second dielectric constant that is less than the first dielectric constant.

25. The power amplifier circuit of claim 23, wherein:
- the at least two sets of transistor amplifiers are coupled in parallel to each other and coupled in series to the second end of different ones of the spiral transmission lines to receive and amplify the component output signals to generate the amplified component output signals; and
- the transistor amplifiers of each set of transistor amplifiers are configured to turn on at different power levels of the input signal relative to each other.

* * * * *

UNITED STATES PATENT AND TRADEMARK OFFICE
CERTIFICATE OF CORRECTION

| | | |
|---|---|---|
| PATENT NO. | : 7,764,120 B2 | Page 1 of 1 |
| APPLICATION NO. | : 12/194269 | |
| DATED | : July 27, 2010 | |
| INVENTOR(S) | : Pengelly | |

It is certified that error appears in the above-identified patent and that said Letters Patent is hereby corrected as shown below:

In the Claims:

Column 12, Claim 1, Line 47: Please correct "slitters" to read -- splitters --

Column 14, Claim 12, Line 26: Please correct "slitter" to read -- splitter --

Signed and Sealed this
Fifteenth Day of February, 2011

David J. Kappos
*Director of the United States Patent and Trademark Office*